(12) United States Patent
Harada et al.

(10) Patent No.: US 10,854,376 B2
(45) Date of Patent: Dec. 1, 2020

(54) COIL COMPONENT AND LC COMPOSITE COMPONENT

(71) Applicant: TDK CORPORATION, Tokyo (JP)

(72) Inventors: Akihiro Harada, Tokyo (JP); Yoshihiro Shinkai, Tokyo (JP); Kyohei Takahashi, Tokyo (JP); Tomoya Hanai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 302 days.

(21) Appl. No.: 16/013,657

(22) Filed: Jun. 20, 2018

(65) Prior Publication Data

US 2019/0006095 A1    Jan. 3, 2019

(30) Foreign Application Priority Data

Jun. 29, 2017    (JP) ................................ 2017-127886

(51) Int. Cl.
| | | |
|---|---|---|
| *H01F 27/40* | (2006.01) | |
| *H01F 1/33* | (2006.01) | |
| *H01G 4/40* | (2006.01) | |
| *H03H 7/01* | (2006.01) | |
| *H03H 1/00* | (2006.01) | |
| *H01F 27/28* | (2006.01) | |

(Continued)

(52) U.S. Cl.
CPC .............. *H01F 27/40* (2013.01); *H01F 1/33* (2013.01); *H01F 17/0013* (2013.01); *H01F 27/255* (2013.01); *H01F 27/2804* (2013.01); *H01F 27/292* (2013.01); *H01G 4/40* (2013.01); *H03H 1/00* (2013.01); *H03H 7/0115* (2013.01); *H01F 2017/0066* (2013.01); *H01F 2027/2809* (2013.01); *H01G 4/248* (2013.01); *H01G 4/30* (2013.01); *H03H 2001/0057* (2013.01); *H03H 2001/0085* (2013.01)

(58) Field of Classification Search
CPC .... H01F 27/40; H01F 27/2847; H01F 27/255; H01F 1/147; H01F 1/0054; H01F 1/0027; H01F 1/01; H01F 1/26; H01F 1/33; H01F 17/0006; H01F 17/0033; H01F 27/2804; H01F 1/24; H01F 1/04; H01F 2027/2809; H01F 2027/292; H01F 2017/0013; H01F 2017/0066; H01F 2017/048; G11B 5/70; H01G 4/40; H01G 4/30; H01G 4/248; H03H 2001/0085; H03H 2001/0057; H03H 1/00; H03H 7/0115
See application file for complete search history.

(56) References Cited

U.S. PATENT DOCUMENTS

| | | | |
|---|---|---|---|
| 7,670,693 B2* | 3/2010 | Motohashi ............... | G11B 5/70 428/212 |
| 2015/0102888 A1* | 4/2015 | Kim ..................... | H01F 17/0013 336/200 |
| 2017/0186521 A1* | 6/2017 | Nakamura ................ | B22F 1/02 |

FOREIGN PATENT DOCUMENTS

JP    2013-207234 A    10/2013

* cited by examiner

*Primary Examiner* — Bryan R Perez
(74) *Attorney, Agent, or Firm* — Oliff PLC (57) ABSTRACT

A coil component includes a coil and a composite magnetic material containing magnetic particles. The magnetic particles have an average minor-axis length of more than 5.0 nm and 50 nm or less and an average aspect ratio of 2.0 or more and 10.0 or less. The magnetic particles are orientated substantially perpendicularly to a central axis of the coil and are orientated randomly within a perpendicular plane to the central axis of the coil. The composite magnetic material has a saturation magnetization σs of 80.0 emu/g or more.

16 Claims, 5 Drawing Sheets

(51) Int. Cl.
*H01F 27/255* (2006.01)
*H01F 17/00* (2006.01)
*H01F 27/29* (2006.01)
*H01G 4/30* (2006.01)
*H01G 4/248* (2006.01)

COIL COMPONENT AND LC COMPOSITE COMPONENT

BACKGROUND OF THE INVENTION

1. Field of the Invention

The present invention relates to a coil component and an LC composite component.

2. Description of the Related Art

In recent years, wireless communication devices, such as cellular phones and portable information terminals, have been used in higher frequency band, and radio signal frequency has been used in GHz band. Then, a magnetic material having a comparatively high permeability even in high-frequency region of GHz band is applied to electronic components used in high-frequency region of GHz band so as to achieve improvement in filter efficiency or downsizing of antenna size.

Patent Document 1 discloses that a low magnetic loss and a high permeability are achieved in high-frequency region of GHz band by using a composite material where magnetic particles have an average aspect ratio of 3 or more and less than 60.

At present, however, it is required to provide electronic components achieving further low magnetic loss and high permeability in high-frequency region of GHz band. Here, electronic components with low magnetic loss and high permeability have high inductance and high Q value. That is, it is required to provide coil components and LC composite components having high inductance and high Q value in high-frequency region of GHz band.

Patent Document 1: JP2013207234 (A)

SUMMARY OF THE INVENTION

It is an object of the invention to provide a coil component and an LC composite component having a high inductance and a high Q value in high-frequency region of GHz band.

To achieve the above object, a coil component according to the first aspect of the present invention comprises a coil and a composite magnetic material containing magnetic particles, wherein the magnetic particles have an average minor-axis length of more than 5.0 nm and 50 nm or less and an average aspect ratio of 2.0 or more and 10.0 or less, the magnetic particles are orientated substantially perpendicularly to a central axis of the coil and are orientated randomly within a perpendicular plane to the central axis of the coil, and the composite magnetic material has a saturation magnetization σs of 80 emu/g or more.

The composite magnetic material may comprise the magnetic particles and a binder.

The magnetic particles may comprise Fe and/or Co.

The composite magnetic material may comprise the magnetic particles covered by an oxygen-containing layer.

An LC composite component according to the second aspect of the present invention comprises:

a coil part including a coil and a composite magnetic material containing magnetic particles; and a capacitor part including a dielectric layer, wherein the magnetic particles have an average minor-axis length of more than 5.0 nm and 50 nm or less and an average aspect ratio of 2.0 or more and 10.0 or less, wherein the magnetic particles are orientated substantially perpendicularly to a central axis of the coil and are orientated randomly within a perpendicular plane to the central axis of the coil, and wherein the composite magnetic material has a saturation magnetization σs of 80 emu/g or more.

The composite magnetic material may comprise the magnetic particles and a binder.

The magnetic particles may comprise Fe and/or Co.

The composite magnetic material may comprise the magnetic particles covered by an oxygen-containing layer.

The coil component and the LC composite component according to the present invention have the above-mentioned structure, and thereby have a high inductance and a high Q value in high-frequency region.

DETAILED DESCRIPTION OF THE PREFERRED EMBODIMENT

Hereinafter, the present invention is described based on the embodiments shown in the figures.

First Embodiment

Figure 1:
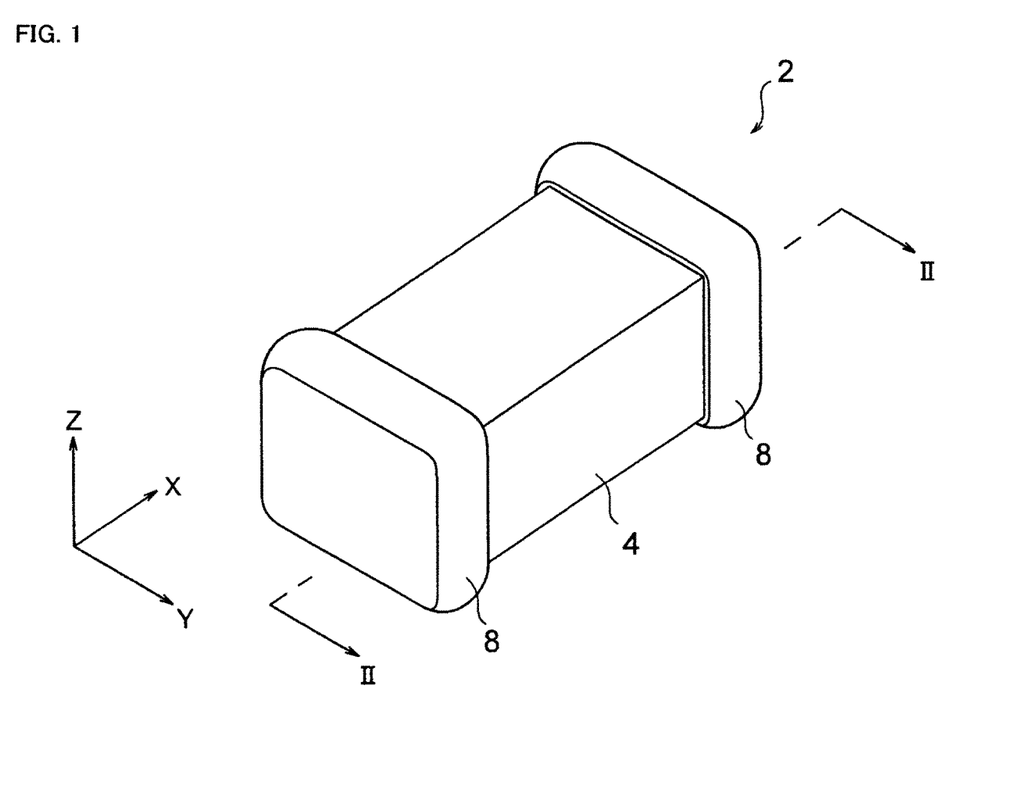
FIG. 1 is a perspective view of a multilayer inductor according to First Embodiment.
Figure 2:
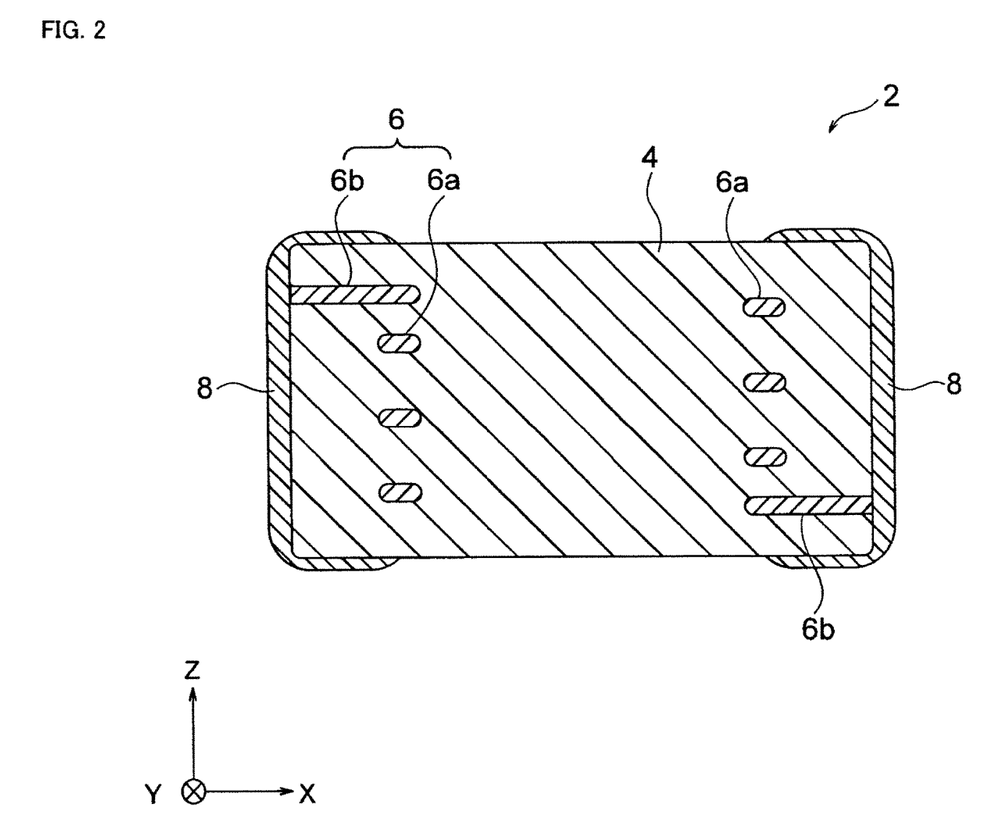
FIG. 2 is a cross-sectional view where the multilayer inductor of FIG. 1 is cut along the II-II line.

As shown in FIG. 1 and FIG. 2, a multilayer inductor 2 according to First Embodiment has a core 4, a coil 6, and terminal electrodes 8. The coil 6 is formed by a conductor 6a and lead parts 6b. The conductor 6a is formed three-dimensionally and helically in the core 4. The lead parts 6b are connected with the terminal electrodes 8. The conductor 6a and the lead parts 6b are formed by any structure. For example, the conductor 6a and the lead parts 6b are formed by a conducting wire and an insulating cover layer covering an outer circumference of the conducting wire as necessary.

In the present embodiment, a pair of lead parts 6b is led from the coil 6 in the X-axis direction and is connected with a pair of terminal electrodes 8. In the present embodiment, each of the terminal electrodes 8 is closely joined with a part of the side surfaces and the top and bottom surfaces of the core 4.

In the present embodiment, the bottom surface of the core 4 is formed approximately in parallel to a plane passing through the X-axis and the Y-axis, which are perpendicular to each other, and the winding axis of the coil 6 is approximately parallel to the Z-axis, which is perpendicular to the plane passing through the X-axis and the Y-axis. In the present embodiment, the top surface of the core 4 is approximately parallel to the bottom surface, and the four side surfaces are approximately perpendicular to the top and bottom surfaces. In the present embodiment, however, the core 4 is not limited to a hexahedron, but may have a shape of cylinder, elliptic cylinder, polygonal prism, etc. The lead parts 6 and the terminal electrodes 8 also have any shape.

The multilayer inductor 2 according to the present embodiment has any size. For example, the multilayer inductor 2 has a width in the X-axis direction of 0.3 to 4 mm, a width in the Y-axis direction of 0.3 to 6 mm, and a height in the Z-axis direction of 0.3 to 2 mm.

The core 4 is made of a composite magnetic material containing magnetic particles. The magnetic particles are any material, but preferably contain Fe and/or Co, and more preferably contain an essential element of Fe. Preferably, the Fe content is 30 mass % or more and 100 mass % or less. Preferably, the Co content is 0 mass % or more and 70 mass % or less.

The magnetic particles may contain other elements, such as Ni, V, Cr, Mn, Cu, Zn, Mg, Ca, Sr, Ba, rare earth elements, Ti, Zr, Hf, Nb, Ta, Zn, Al, Ga, and Si. The amount of other elements is not limited, but is preferably 5 mass % or less in total with respect to the entire magnetic particles.

Preferably, the composite magnetic material contains an oxygen-containing layer covering the magnetic particles. The oxygen-containing layer is formed by any phase. For example, the oxygen-containing layer is formed by a phase containing oxygen and one or more elements of Mg, Ca, Sr, Ba, rare earth elements, Ti, Zr, Hf, Nb, Ta, Zn, Al, Ga, Si, Sn, and Bi. The oxygen-containing layer has any thickness, such as 1.0 nm or more and 5.0 nm or less. Preferably, the oxygen-containing layer has a thickness of 1.0 nm or more and 3.0 nm or less. The thickness of the oxygen-containing layer is measured by any method, such as TEM. When the composite magnetic material contains an oxygen-containing layer having a thickness of 1.0 nm or more and covering the magnetic particles, the oxidation of the magnetic particles tends to be prevented. When the insulation among the magnetic particles is secured, an eddy current loss is prevented, and Q value tends to be prevented from decreasing. When the oxygen-containing layer has a thickness of 3.0 nm or less, saturation magnetization σs tends to increase.

Here, the magnetic particles of the present embodiment have an average minor-axis length of more than 5.0 nm and 50 nm or less and an average aspect ratio of 2.0 or more and 10.0 or less. When the average minor-axis length is too small, inductance L in high-frequency region tends to decrease. When the average minor-axis length is too large, Q value in high-frequency region tends to decrease. When the average aspect ratio is too small, Q value in high-frequency region tends to decrease. When the average aspect ratio is too large, inductance L in high-frequency region tends to decrease.

When the average minor-axis length and the average aspect ratio are within the above-mentioned ranges, the magnetic particles may have any shape, such as bar, needle, and spindle. In particular, the magnetic particles preferably have a bar shape because inductance L and Q value in high-frequency region tend to increase.

Preferably, the composite magnetic material contains a binder in addition. When the composite magnetic material contains a binder, the insulation property among the magnetic particles is further enhanced, and Q value is further prevented from decreasing. The binder is not limited, but is preferably a resin, such as epoxy resin, phenol resin, acrylic resin, polyimide, polyamideimide, silicone resin, and resin made by mixing them. Preferably, the binder is an epoxy resin, a phenol resin, or an acrylic resin. More preferably, the binder is an epoxy resin.

The amount of the binder in the composite magnetic material is not limited, and is determined adequately based on type, composition, shape, and the like of the magnetic particles and type of the binder. When the amount of the binder is too large, saturation magnetization σs of the composite magnetic material tends to decrease. Incidentally, the saturation magnetization σs of the composite magnetic material of the present embodiment is 80.0 emu/g or more. When the saturation magnetization σs is too small, inductance L and Q value in high-frequency region tend to decrease.

In the multilayer inductor 2 according to the present embodiment, the magnetic particles constituting the composite magnetic material contained in the core 4 are orientated perpendicularly to the central axis (Z-axis) of the coil 6, and are oriented randomly within a plane (X-Y plane) perpendicular to the central axis of the coil 6.

The orientation of the magnetic particles is explained with reference to FIG. 3 and FIG. 4. Incidentally, the orientation of the magnetic particles can be confirmed by observation of the cross section of the core 4 using a SEM.

Figure 3:
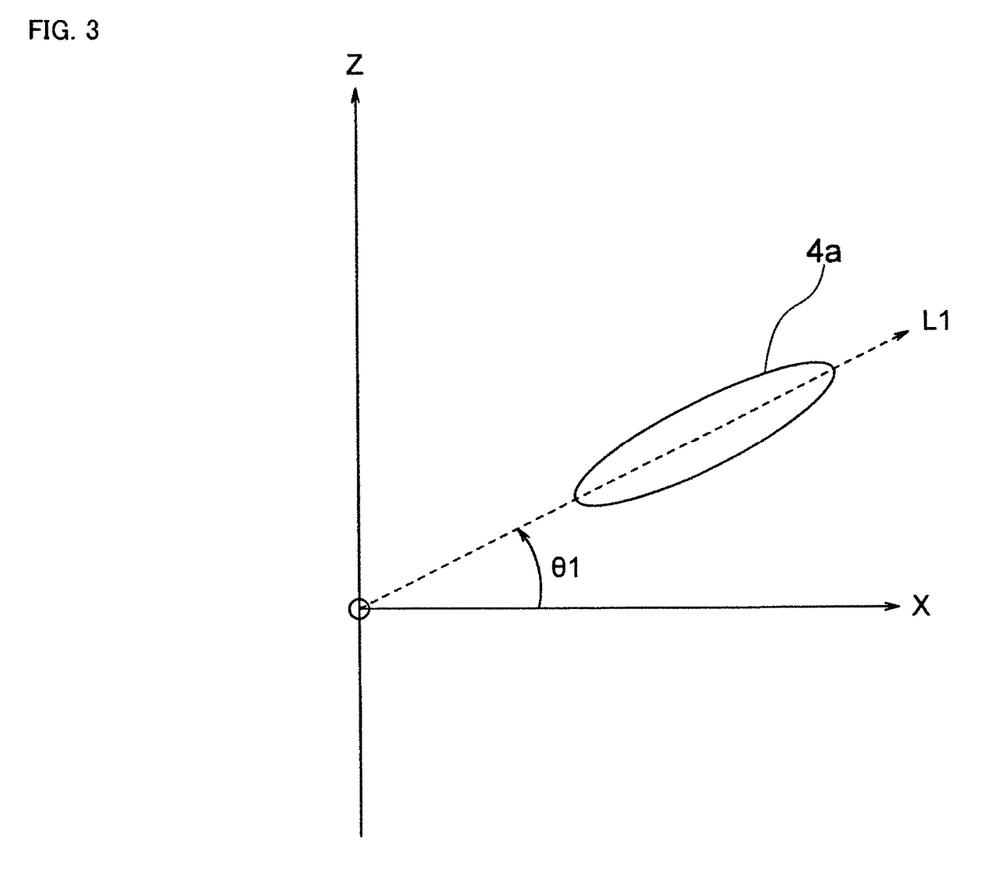
FIG. 3 is an X-Z plane for explanation of orientation of magnetic particles.

FIG. 3 illustrates one magnetic particle 4a. In FIG. 3, the vertical axis is the Z-axis, and the horizontal axis is any direction perpendicular to the Z-axis. For example, the horizontal axis may be the X-axis as shown in FIG. 3.

In the X-Z plane shown in FIG. 3, a line L1 is taken in the major axis of the magnetic particle 4a, and an angle of the line L1 to the X-axis is given θ1 ($-90°≤θ1≤90°$).

When a ratio of the magnetic particles 4a satisfying $-30°≤θ1≤30°$ to all of the magnetic particles is 70% or more based on particle number, the magnetic particles are considered to be orientated perpendicularly to the central axis (Z-axis) of the coil 6. In the following explanation, this orientation may just be referred to as "perpendicular orientation".

Figure 4:
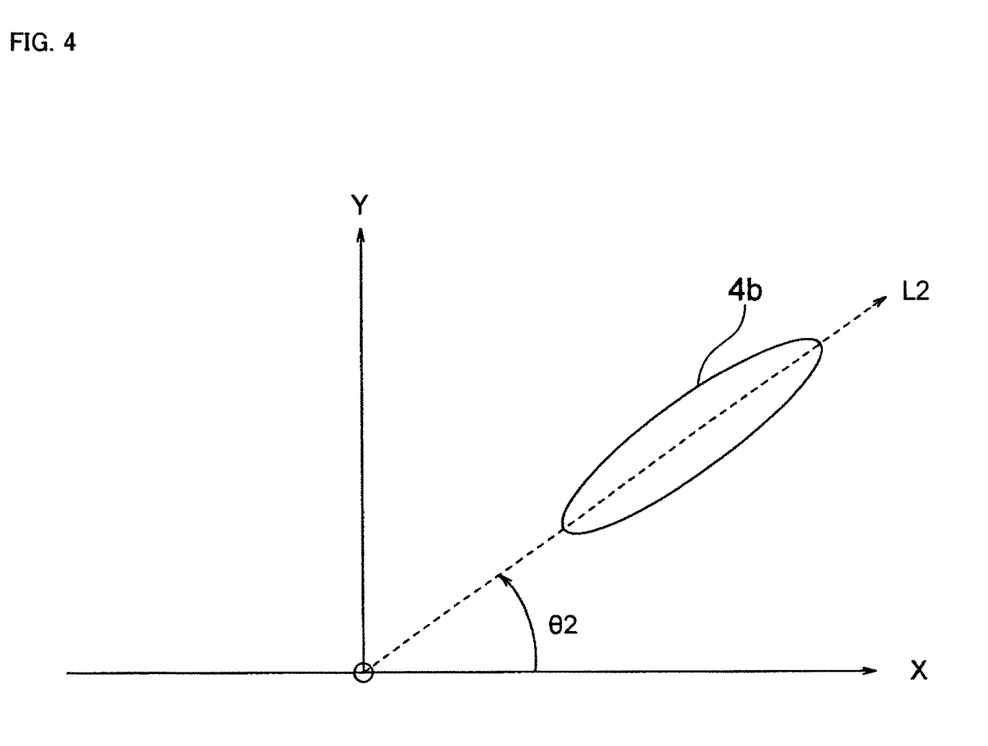
FIG. 4 is an X-Y plane for explanation of orientation of magnetic particles.

FIG. 4 illustrates one magnetic particle 4b. In FIG. 4, the vertical axis is the Y-axis and the horizontal axis is the X-axis, but the vertical axis and the horizontal axis may be any direction as long as they are parallel to the X-Y plane.

As shown in FIG. 4, a line L2 is taken in the major axis of the magnetic particle 4b, and an angle of the line L2 to the horizontal axis (X-axis) is θ2 ($0°≤θ2≤180°$).

When a ratio of the magnetic particles satisfying $0°≤θ2≤45°$ is 20% or more and 30% or less and a ratio of the magnetic particles satisfying $90°≤θ2≤135°$ is 20% or more and 30% or less, with respect to all of the magnetic particles based on particle number, the magnetic particles are orientated randomly within a plane perpendicular to the central axis (Z-axis) of the coil 6 even if the vertical axis and the horizontal axis are set to any direction that is parallel to the X-Y plane. The random orientation may be referred to as non-orientation.

When the magnetic particles contained in the composite material according to the present embodiment are orientated perpendicularly to the central axis of the coil 6 and are orientated randomly within a plane perpendicular to the central axis of the coil 6, inductance L and Q value in high-frequency region can be increased significantly. When the magnetic particles are not orientated perpendicularly to the central axis of the coil 6 or are not orientated randomly within a plane perpendicular to the central axis of the coil 6, Q value tends to decrease significantly.

Hereinafter, a method of producing the coil component according to the present embodiment is described, but the coil component according to the present embodiment is not limited to being produced by the following method.

Initially, a magnetic powder containing the above-mentioned magnetic particles is produced. The magnetic powder is produced by any method, such as a conventional method in this technical field. For example, the magnetic powder may be produced by a known method of heat reduction of a raw material powder composed of a compound, such as α-FeOOH or α-FeOOH containing Co. The composition of the magnetic powder to be obtained can be determined by controlling the amount of Fe, Co, and/or other elements in the raw material powder.

Here, the average minor-axis length and the average aspect ratio of the magnetic particles contained in the composite magnetic material can be determined by controlling the average minor-axis length and the average aspect ratio of the raw material powder. Incidentally, the method of determining the average minor-axis length and the average aspect ratio of the magnetic particles contained in the composite magnetic material is not limited to the above-mentioned method.

When the magnetic powder is covered with an oxygen-containing layer, there is a method where the raw material powder is added with one or more of Mg, Ca, Sr, Ba, rare earth elements, Ti, Zr, Hf, Nb, Ta, Zn, Al, Ga, Si, Sn, and Bi, and then heat reduction is performed. The one or more elements are put in the raw material powder by any method. For example, the one or more elements are put in the raw material powder in such a manner that the raw material powder and a solution containing the one or more elements are mixed, adjusted as to pH, filtered, and dried. The thickness of the oxygen-containing layer can be determined by controlling the concentration of the solution containing the one or more elements, pH, the mixing time, gradual oxidation conditions after the heat reduction, and the like.

A paste for magnetic material is obtained by mixing the magnetic powder obtained by the above-mentioned heat reduction, a binder, and a solvent. The magnetic powder and the binder in the paste for magnetic material are mixed at any ratio. For example, the paste for magnetic material is obtained by adding a solution containing 1 to 15 mass % of an epoxy resin, which is the binder, to 100 mass % of the magnetic powder. The saturation magnetization σs of the composite magnetic material to finally be obtained can be determined by controlling the amount of the epoxy resin.

The solvent of the paste for magnetic material may be acetone, IPA, MEK, BCA, methanol, etc. The binder may be a resin binder, a dispersant, etc. The resin binder may be an epoxy resin, an acrylic resin, a polyimide resin, a polyamide resin, a phenol resin, a silicone resin, etc. The dispersant may be a Si coupling agent, an oleic acid, an oleylamine etc.

Next, the paste for magnetic material is turned into sheets by a doctor-blade method, and magnetic sheets are produced.

In the present embodiment, a feeding speed of the sheets and a distance between a blade and a carrier film are controlled appropriately based on composition, shape, and the like of the composite magnetic material. When a feeding speed of the sheet and a distance between a blade and a carrier film are controlled appropriately, the presence of orientation of the magnetic particles in the coil component to finally be obtained can be controlled.

The magnetic particles more easily have perpendicular orientation as the distance between a blade and a carrier film is smaller. The magnetic particles are more easily orientated randomly (non-orientation) within the X-Y plane as the feeding speed of the sheets is slower. When the distance between a blade and a carrier film is too small, however, the composite magnetic particles are aggregated easily. When the feeding speed of the sheets is too slow, the magnetic particles are also aggregated easily.

A favorable distance between a blade and a carrier film changes depending on the composition and shape of the magnetic particles, but is preferably smaller than a normal distance in this technical field. For example, a favorable distance between a blade and a carrier film is 1 μm or more and 10 μm or less. A favorable feeding speed of the sheets also changes depending on the composition and shape of the magnetic particles, but is preferably slower than a normal speed in this technical field. For example, a favorable feeding speed of the sheets may be 1.0 mm/sec or more and 5.0 mm/sec or less.

Next, the magnetic sheets obtained are dried so as to vaporize the solvent. Then, the multilayer inductor 2 is produced using the magnetic sheets.

The multilayer inductor 2 is produced by any method, such as a conventional method. For example, the core 4 can be obtained by laminating and pressing the magnetic sheets obtained in the above-mentioned step in the Z-axis direction of FIG. 1. At this time, the coil 6 is contained by a conventional process. For example, the magnetic sheets may be laminated after a coil pattern is printed on the magnetic sheets. Then, the multilayer inductor 2 is produced by forming the terminal electrodes 8 on the core 4.

The core 4 formed by a sintered body may be obtained by sintering after the lamination. The core 4 may be obtained by another method. In the present embodiment, however, the magnetic particles contained in the core 4 need to have perpendicular orientation and need to be orientated randomly (non-orientation) within the X-Y plane even if the core 4 is obtained by any method.

The multilayer inductor is described in the present embodiment, but the coil component of the present invention is not limited to multilayer inductors, and may be a winding inductor, a thin film inductor, and the like. Moreover, the coil component of the present invention is used for any purpose, such as transformers and antennas.

Second Embodiment

Hereinafter, Second Embodiment is described, but items not specifically described are common to First Embodiment.

Figure 5:
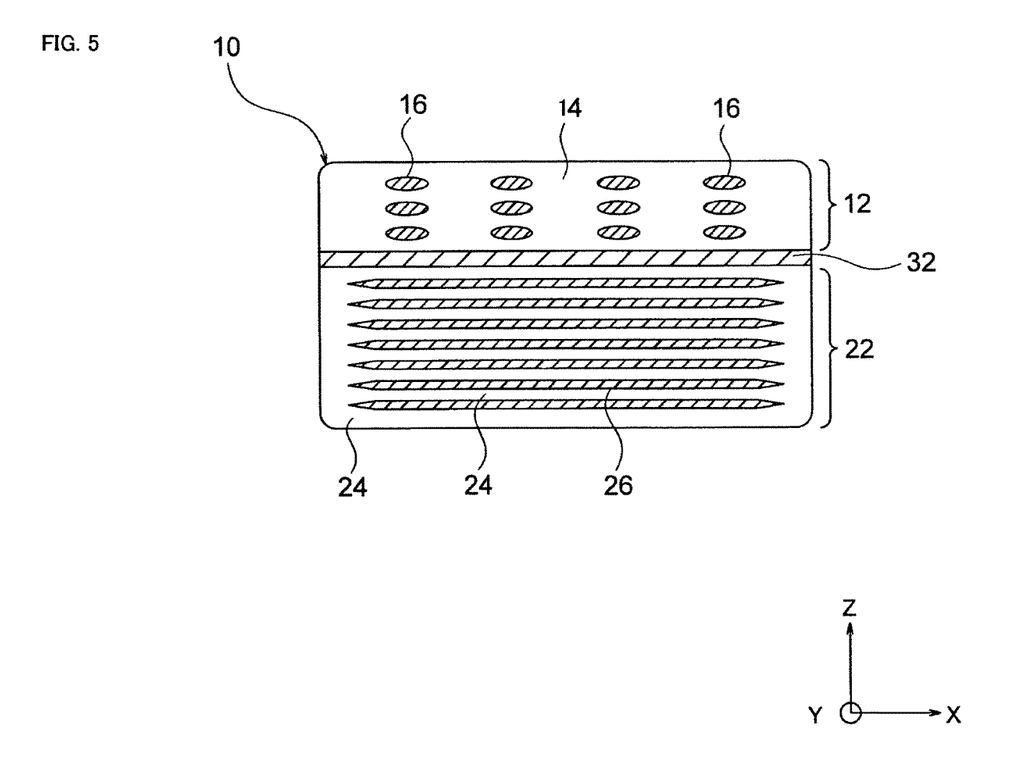
FIG. 5 is a cross-sectional view of a composite electronic component according to Second Embodiment.

In an LC composite component 10 according to Second Embodiment of the present invention, as shown in FIG. 5, a coil part 12 and a capacitor part 22 are formed above and below, and an intermediate material layer 32 is present between the coil part 12 and the capacitor part 22 and is integrated therewith.

The coil part 12 has a core 14 and a coil 16. The coil 16 is wound by a conductor 16a in a coil shape in the core 14.

The core 14 is formed of a composite magnetic material containing magnetic particles. The magnetic particles are any material, but preferably contain Fe and/or Co, and more preferably contain an essential element of Fe. Preferably, the composite magnetic material contains an oxygen-containing layer covering the magnetic particles. The oxygen-containing layer is formed by any phase.

Here, the magnetic particles of the present embodiment have an average minor-axis length of more than 5.0 nm and 50 nm or less and an average aspect ratio of 2.0 or more and 10.0 or less. When the average minor-axis length is too small, inductance L in high-frequency region tends to decrease. When the average minor-axis length is too large, Q value in high-frequency region tends to decrease. When the average aspect ratio is too small, Q value in high-frequency region tends to decrease. When the average aspect ratio is too large, inductance L in high-frequency region tends to decrease.

When the average minor-axis length and the average aspect ratio are within the above-mentioned ranges, the magnetic particles may have any shape.

Preferably, the composite magnetic material contains a binder in addition. Preferably, the binder is a resin.

The amount of the binder in the composite magnetic material is not limited, and is favorably determined based on type, composition, shape, and the like of the magnetic particles. When the amount of the binder is too large, saturation magnetization σs of the composite magnetic material tends to decrease. Incidentally, the saturation magnetization σs of the composite magnetic material of the present embodiment is 80.0 emu/g or more. When the saturation magnetization σs is too small, inductance L and Q value in high-frequency region tend to decrease.

In the coil part 12 according to the present embodiment, the magnetic particles are orientated perpendicularly to the central axis (Z-axis) of the coil 16, and are oriented randomly within a plane (X-Y plane) perpendicular to the central axis of the coil 16.

When the magnetic particles contained in the composite material according to the present embodiment are orientated perpendicularly to the central axis of the coil 16 and are orientated randomly within a plane perpendicular to the central axis of the coil 16, inductance L and Q value in high-frequency region can be increased significantly. When the magnetic particles are not orientated perpendicularly to the central axis of the coil 16 or are not orientated randomly within a plane perpendicular to the central axis of the coil 16, Q value tends to decrease significantly.

The capacitor part 22 has a multilayer structure where dielectric layers 24 and internal electrode layers 26 are stacked alternately. Incidentally, the internal electrode layers 26 are not essential. Only external electrodes may be present.

The intermediate material layer 32 has a structure where the coil part 12 and the capacitor part 22 can be integrated. The intermediate material layer 32 may not exist.

The LC composite component 10 according to the present embodiment is produced by any method, such as a conventional method of producing composite electronic components. For example, magnetic sheets are produced similarly to First Embodiment, and dielectric sheets can be produced additionally. Then, both sheets are laminated and pressed appropriately, and the LC composite component 10 according to the present embodiment is thereby obtained. The LC composite component 10 can be obtained by other methods. In the present embodiment, however, the magnetic particles contained in the core 14 of the coil part 12 need to have perpendicular orientation and need to be orientated randomly (non-orientation) within the X-Y plane even if the LC composite component 10 is obtained by any method.

FIG. 5 illustrates that the coil part 12 and the capacitor part 22 are arranged in the stacking direction (Z-axis direction), but the coil part 12 and the capacitor part 22 may be arranged in a perpendicular direction to the stacking direction (parallel direction to the X-Y plane). In this case, the intermediate material layer 32 tends to be unnecessary.

The LC composite component 10 according to the present embodiment is used for any purpose. For example, the LC composite component 10 according to the present embodiment is used for general electronic components including a coil and a capacitor, in addition to LC filters.

Example

Next, the present invention is described in more detail based on specific examples, but is not limited to the following examples.

Initially, a magnetic powder was prepared. The magnetic powder was prepared by a known method where a powder of a bar-shaped α-FeOOH was heated and reduced in $H_2$.

The composition of the magnetic powder was determined by controlling the amount of Co in the powder of the bar-shaped α-FeOOH.

Moreover, the average minor-axis length and the average aspect ratio were controlled by changing the shape of the bar-shaped α-FeOOH. When the shape of the magnetic powder itself was set to sphere or flat, a spherical or flat $Fe_2O_4$ was used.

Before the above-mentioned heat reduction, an oxygen-containing layer covering the magnetic particles may be formed. For example, when the magnetic particles were covered with a layer containing Al and O, the bar-shaped α-FeOOH containing Co was mixed in a solution of $Al_2(SO_4)_3$, adjusted as to pH, filtered, and dried, before the above-mentioned heat reduction. When the magnetic particles were covered with a layer containing Y and O, the bar-shaped α-FeOOH containing Co was mixed in a solution of $Y(NO_3)_3$, adjusted as to pH, filtered, and dried, before the above-mentioned heating and reduction. When the magnetic particles were covered with a layer containing Si and O, the bar-shaped α-FeOOH containing Co was mixed in a solution of $Na_2SiO_3$, adjusted to pH, filtered, and dried, before the above-mentioned heating and reduction.

When the magnetic particles were covered with Al, Y, and O, the magnetic particles were initially covered with Al and O and dried, in the above-mentioned manner. Then, the magnetic particles were covered with Y and O in the above-mentioned manner. When the magnetic particles were covered with Al, Si, and O, the magnetic particles were initially covered with Al and O and dried, in the above-mentioned manner. Then, the magnetic particles were covered with Si and O in the above-mentioned manner.

The magnetic powder obtained by the above-mentioned method was turned into a solid-liquid mixture, and a paste for magnetic material was prepared. 10 parts by mass of an epoxy resin as a resin binder were added to 100 parts by mass of the magnetic powder. Here, saturation magnetization σs of the composite magnetic material to finally be obtained can be determined by controlling the amount of the epoxy resin. In general, saturation magnetization σs tends to be higher as the amount of the epoxy resin is smaller. In only Comparative Example 10, the amount added of the epoxy resin was larger than the above-mentioned amount, and saturation magnetization σs was decreased.

The paste for magnetic material was prepared by adding and mixing 100 parts by mass of BCA as a solvent and 6 parts by mass of a Si coupling agent as a dispersant with respect to 100 parts by mass of the magnetic powder.

Moreover, magnetic sheets were produced by a doctor-blade method using the paste for magnetic material. At this time, a feeding speed of the sheets and a distance between a blade and a carrier film were changed appropriately depending on composition, shape, and the like of the mixed powders. When the feeding speed of the sheets and the distance between the blade and the carrier film were controlled appropriately, the presence of orientation of the magnetic particles in the multilayer inductor to finally be obtained was controlled.

Specifically, the distance between the blade and the carrier film was 1 μm or more and 10 μm or less in samples where magnetic particles had perpendicular orientation (including samples where magnetic particles were spherical). In a sample where magnetic particles did not have perpendicular orientation, the distance between the blade and the carrier film was 50 μm. In samples where magnetic particles were randomly orientated within the X-Y plane (including a sample having spherical or flat magnetic particles), the feeding speed of the sheets was 1.0 mm/sec or more and 5.0 mm/sec or less. In a sample where magnetic particles were orientated within the X-Y plane, the feeding speed of the sheets was 20 mm/sec.

The magnetic sheets obtained were dried so as to vaporize the solvent. Then, a coil pattern was printed on the magnetic sheets so that multilayer inductors having a common shape of FIG. 1 in each Example and Comparative Example were obtained. Specifically, the winding number of the coil was 3.5, and the average diameter of the coil was 0.3 mm. Then, external electrodes were formed on a core formed by stacking and pressing the magnetic sheets in the Z-axis direction of FIG. 1, and a multilayer inductor in each Example and Comparative Example was obtained. In the core of the multilayer inductor, the length in the X-axis direction was 0.5 mm, the length in the Y-axis direction was 0.65 mm, and the length in the Z-axis direction was 0.4 mm. The pressure and time during the above-mentioned pressing were appropriately controlled so that a multilayer inductor having most preferable properties was obtained in each Example and Comparative Example. In the pressing, the pressure was 98 to 588 MPa, and the pressing time was appropriately controlled within 10 to 600 seconds.

The saturation magnetization σs of the core in each Example and Comparative Example was measured using VSM. In the present examples, a saturation magnetization σs of 80 emu/g or more was considered to be favorable. The results are shown in Table. 1.

In each Example and Comparative Example, inductance (L) and Q value (Q) were measured using an impedance analyzer. Also measured were inductance ($L_0$) and Q value ($Q_0$) of an air-core coil having the same shape as each Example and Comparative Example. Then, $\Delta L/L_0$ (%) and $\Delta Q/Q_0$ (%) at 2.4 GHz were calculated, where $\Delta L=L-L_0$ and $\Delta Q=Q-Q_0$ were satisfied. The results are shown in Table 1. In the present examples, $\Delta L/L_0$ satisfying 10% or more was considered to be favorable, and $\Delta Q/Q_0$ satisfying 0.1% or more was considered to be favorable. The results are shown in Table 1.

In each Example and Comparative Example, the average minor-axis length and the average aspect ratio of the magnetic particles were measured using a SEM. The results are shown in Table 1. Confirmed using a SEM were whether the magnetic particles had perpendicular orientation and whether the magnetic particles were randomly orientated within the X-Y plane. The results are shown in Table 1.

TABLE 1

| Sample No. | magnetic particles | particle shape | perpendicular orientation | orientation within plane | average minor-axis length (nm) | average aspect ratio | oxygen-containing layer | σ s (emu/g) | Δ L/L0 (%) [2.4 GHz] | Δ Q/Q0 (%) [2.4 GHz] |
|---|---|---|---|---|---|---|---|---|---|---|
| Ex. 1 | Fe | bar | orientation | non-orientation | 18 | 2.8 | (Al, O) | 116 | 34.5 | 1.1 |
| Ex. 3 | $Fe_{95}Ni_5$ | bar | orientation | non-orientation | 22 | 3.1 | (Al, O) | 118 | 31.0 | 5.4 |
| Ex. 4 | $Fe_{95}Co_5$ | bar | orientation | non-orientation | 22 | 3.0 | (Al, O) | 119 | 23.8 | 10.8 |
| Ex. 5 | $Fe_{90}Co_{10}$ | bar | orientation | non-orientation | 20 | 2.8 | (Al, O) | 122 | 21.4 | 13.5 |
| Ex. 6 | $Fe_{70}Co_{30}$ | bar | orientation | non-orientation | 20 | 3.0 | (Al, O) | 135 | 19.0 | 16.2 |
| Ex. 7 | $Fe_{45}Co_{55}$ | bar | orientation | non-orientation | 20 | 3.1 | (Al, O) | 152 | 14.3 | 12.2 |
| Comp. Ex. 1 | $Fe_{70}Co_{30}$ | *spherical* | — | — | 22 | *1.1* | (Al, O) | 134 | 30.5 | *-17.6* |
| Comp. Ex. 2 | $Fe_{70}Co_{30}$ | *flat* | orientation | — | 9 | 4.9 | (Al, O) | 122 | 21.7 | *-13.5* |
| Comp. Ex. 3 | $Fe_{70}Co_{30}$ | bar | *non-orientation* | non-orientation | 19 | 3.2 | (Al, O) | 132 | 23.3 | *-1.6* |
| Comp. Ex. 4 | $Fe_{70}Co_{30}$ | bar | orientation | *orientation* | 22 | 3.1 | (Al, O) | 135 | 17.9 | *-1.1* |
| Comp. Ex. 5 | $Fe_{70}Co_{30}$ | bar | orientation | non-orientation | *5* | 3.0 | (Al, O) | 81 | *4.8* | 3.8 |
| Ex. 8 | $Fe_{70}Co_{30}$ | bar | orientation | non-orientation | 7 | 3.0 | (Al, O) | 119 | 11.0 | 10.8 |
| Ex. 6 | $Fe_{70}Co_{30}$ | bar | orientation | non-orientation | 20 | 3.0 | (Al, O) | 135 | 19.0 | 16.2 |
| Ex. 9 | $Fe_{70}Co_{30}$ | bar | orientation | non-orientation | 50 | 3.1 | (Al, O) | 138 | 24.3 | 0.9 |
| Comp. Ex. 6 | $Fe_{70}Co_{30}$ | bar | orientation | non-orientation | *53* | 3.0 | (Al, O) | 139 | 24.8 | *-0.5* |
| Comp. Ex. 7 | $Fe_{70}Co_{30}$ | bar | orientation | non-orientation | 21 | *1.8* | (Al, O) | 138 | 28.6 | *-5.4* |
| Ex. 10 | $Fe_{70}Co_{30}$ | bar | orientation | non-orientation | 20 | 2.0 | (Al, O) | 137 | 23.8 | 9.5 |
| Ex. 6 | $Fe_{70}Co_{30}$ | bar | orientation | non-orientation | 20 | 3.0 | (Al, O) | 135 | 19.0 | 16.2 |
| Ex. 11 | $Fe_{70}Co_{30}$ | bar | orientation | non-orientation | 22 | 5.1 | (Al, O) | 131 | 11.9 | 10.3 |
| Ex. 12 | $Fe_{70}Co_{30}$ | bar | orientation | non-orientation | 20 | 9.4 | (Al, O) | 120 | 10.1 | 7.3 |
| Comp. Ex. 8 | $Fe_{70}Co_{30}$ | bar | orientation | non-orientation | 18 | *10.2* | (Al, O) | 116 | *3.6* | 2.7 |
| Ex. 13 | $Fe_{70}Co_{30}$ | bar | orientation | non-orientation | 22 | 3.2 | (Y, O) | 136 | 18.3 | 14.9 |

TABLE 1-continued

| Sample No. | magnetic particles | particle shape | perpendicular orientation | orientation within plane | average minor-axis length (nm) | average aspect ratio | oxygen-containing layer | σ s (emu/g) | Δ L/L0 (%) [2.4 GHz] | Δ Q/Q0 (%) [2.4 GHz] |
|---|---|---|---|---|---|---|---|---|---|---|
| Ex. 14 | Fe$_{70}$Co$_{30}$ | bar | orientation | non-orientation | 20 | 3.1 | (Si, O) | 133 | 19.5 | 15.9 |
| Ex. 15 | Fe$_{70}$Co$_{30}$ | bar | orientation | non-orientation | 21 | 2.9 | (Al, Y, O) | 130 | 17.9 | 16.5 |
| Ex. 16 | Fe$_{70}$Co$_{30}$ | bar | orientation | non-orientation | 22 | 2.9 | (Al, Si, O) | 131 | 18.2 | 16.0 |
| Comp. Ex. 10 | Fe$_{70}$Co$_{30}$ | bar | orientation | non-orientation | 20 | 3.0 | (Al, O) | *74* | *0.3* | *-1.4* |

Table 1 shows that favorable coil properties were obtained in Examples where the magnetic particles had an average minor-axis length and an average aspect ratio in specified ranges and were orientated perpendicularly to the central axis of the coil and orientated randomly within a perpendicular plane (X-Y plane) to the central axis of the coil, and where the saturation magnetization σs of the composite magnetic material was 80 emu/g or more.

On the other hand, unfavorable coil properties were obtained in all of Comparative Examples where the magnetic particles had an average minor-axis length or an average aspect ratio out of the specified range, Comparative Examples where the magnetic particles were not orientated perpendicularly to the central axis of the coil, Comparative Examples where the magnetic particles were not orientated randomly (not non-orientation) within a perpendicular plane to the central axis of the coil, and Comparative Examples where the saturation magnetization σs of the composite magnetic material was less than 80 emu/g.

NUMERICAL REFERENCES

2 . . . multilayer inductor
4 . . . core
6 . . . coil
  6a . . . conductor
  6b . . . lead part
8 . . . terminal electrode
10 . . . LC composite component
12 . . . coil part
14 . . . core
16 . . . coil
22 . . . capacitor part
24 . . . dielectric layer
26 . . . internal electrode layer
32 . . . intermediate material layer

The invention claimed is:

1. A coil component comprising a coil and a composite magnetic material containing magnetic particles, wherein the magnetic particles have an average minor-axis length of more than 5.0 nm and 50 nm or less and an average aspect ratio of 2.0 or more and 10.0 or less, a ratio of the magnetic particles having a major axis oriented at an angle in a range of from −30° to 30° to a horizontal axis to all of the magnetic particles is 70% or more based on particle number, the horizontal axis being perpendicular to a central axis of the coil, and the magnetic particles are orientated randomly within a perpendicular plane to the central axis of the coil, and the composite magnetic material has a saturation magnetization σs of 80.0 emu/g or more.

2. The coil component according to claim 1, wherein the composite magnetic material comprises the magnetic particles and a binder.

3. The coil component according to claim 2, wherein the magnetic particles comprise Fe and/or Co.

4. The coil component according to claim 3, wherein the composite magnetic material comprises the magnetic particles covered by an oxygen-containing layer.

5. The coil component according to claim 2, wherein the composite magnetic material comprises the magnetic particles covered by an oxygen-containing layer.

6. The coil component according to claim 1, wherein the magnetic particles comprise Fe and/or Co.

7. The coil component according to claim 6, wherein the composite magnetic material comprises the magnetic particles covered by an oxygen-containing layer.

8. The coil component according to claim 1, wherein the composite magnetic material comprises the magnetic particles covered by an oxygen-containing layer.

9. An LC composite component, comprising:
a coil part including a coil and a composite magnetic material containing magnetic particles; and
a capacitor part including a dielectric layer,
wherein:
the magnetic particles have an average minor-axis length of more than 5.0 nm and 50 nm or less and an average aspect ratio of 2.0 or more and 10.0 or less,
a ratio of the magnetic particles having a major axis oriented at an angle in a range of from −30° to 30° to a horizontal axis to all of the magnetic particles is 70% or more based on particle number, the horizontal axis being perpendicular to a central axis of the coil,
the magnetic particles are orientated randomly within a perpendicular plane to the central axis of the coil, and
the composite magnetic material has a saturation magnetization σs of 80 emu/g or more.

10. The LC composite component according to claim 9, wherein the composite magnetic material comprises the magnetic particles and a binder.

11. The LC composite component according to claim 10, wherein the magnetic particles comprise Fe and/or Co.

12. The LC composite component according to claim 11, wherein the composite magnetic material comprises the magnetic particles covered by an oxygen-containing layer.

13. The LC composite component according to claim 10, wherein the composite magnetic material comprises the magnetic particles covered by an oxygen-containing layer.

14. The LC composite component according to claim 9, wherein the magnetic particles comprise Fe and/or Co.

15. The LC composite component according to claim 14, wherein the composite magnetic material comprises the magnetic particles covered by an oxygen-containing layer.

16. The LC composite component according to claim 9, wherein the composite magnetic material comprises the magnetic particles covered by an oxygen-containing layer.

* * * * *